(12) United States Patent  
Parker (10) Patent No.: US 8,325,531 B2
(45) Date of Patent: Dec. 4, 2012

(54) MEMORY DEVICE (75) Inventor: Allan Parker, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 330 days.

(21) Appl. No.: 12/683,732

(22) Filed: Jan. 7, 2010

(65) Prior Publication Data

US 2011/0164452 A1    Jul. 7, 2011

(51) Int. Cl.
*G11C 11/34* (2006.01)
(52) U.S. Cl. ......... 365/185.18; 365/185.22; 365/185.11; 365/189.011; 365/189.15; 365/189.05; 365/230.01; 365/230.03; 365/230.08; 365/233.17
(58) Field of Classification Search ............. 365/185.18, 365/185.22, 185.11, 189.011, 189.15, 189.05, 365/230.01, 230.03, 230.08, 233.17
See application file for complete search history.

(56) References Cited

U.S. PATENT DOCUMENTS

| | | | |
|---|---|---|---|
| 7,100,104 B2* | 8/2006 | Yamamoto et al. | 714/786 |
| 8,060,797 B2* | 11/2011 | Hida et al. | 714/704 |
| 2006/0072366 A1* | 4/2006 | Ware et al. | 365/230.06 |
| 2009/0185426 A1* | 7/2009 | Wang et al. | 365/185.18 |
| 2009/0323951 A1* | 12/2009 | Shingal et al. | 380/247 |
| 2010/0074003 A1* | 3/2010 | Schroder | 365/171 |

FOREIGN PATENT DOCUMENTS

JP    07153285 A  *  6/1995

* cited by examiner

*Primary Examiner* — Fernando Hidalgo
(74) *Attorney, Agent, or Firm* — Frommer Lawrence & Haug LLP; Matthew M. Gaffney (57) ABSTRACT Systems (100) and methods (600) for reading data from a memory device (106). The methods involve (606) receiving first read request signals (118, 120, 122, 126, 128) for first data stored in the memory device. In response to the first read request signals, (608) retrieving a first page of data from a cell array (268) of the memory device. The methods also involve (616) receiving second read request signals for second data stored in the memory device. (618) Next, a determination is made as to whether at least a portion of a memory address for the second data is the same as at least a respective portion of a memory address for the first data. (622) If it is determined that the respective portions of the memory addresses are the same, then a read access to the cell array is disabled.

21 Claims, 6 Drawing Sheets

# MEMORY DEVICE

BACKGROUND OF THE INVENTION

1. Statement of the Technical Field

The invention concerns memory devices. More particularly, the invention concerns systems and methods for reading data from a memory device.

2. Description of the Related Art

Conventional memory systems typically comprise a central processing unit, a memory controller, a plurality of memory devices and a memory interface. The memory devices can include, but are not limited to, volatile and non-volatile memory. Non-volatile memory is generally computer memory that can retain stored information even when not powered. Examples of non-volatile memory include read-only memory (ROM), flash memory, Dynamic Random Access Memory (DRAM), Static Random Access Memory (SRAM), hard disks, floppy disk drives, magnetic tapes, and optical disc drives. Flash memory can be a solid state storage device of a NAND type or a solid state storage device of a NOR type. NOR type flash memory has certain advantages over NAND type flash memory. For example, NOR type flash memory has more desirable data retention characteristics than NAND type flash memory. As such, NOR type flash memory has conventionally been used to store certain types of data, such as security data. Error correction codes (ECCs) have been employed for improving the reliability of NOR type flash memory. ECCs are generally codes inserted into the NOR type flash memory for detecting errors in the security data. The memory interface is configured for interfacing the memory controller to each type of memory device. For example, the memory interface can be configured to interface the memory controller with a NAND type flash memory, a DRAM and an SRAM.

BRIEF DESCRIPTION OF THE DRAWINGS

Embodiments will be described with reference to the following drawing figures, in which like numerals represent like items throughout the figures, and in which.

DETAILED DESCRIPTION

The present invention is described with reference to the attached figures, wherein like reference numbers are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is if, X employs A; X employs B; or X employs both A and B, then "X employs A or B" is satisfied under any of the foregoing instances.

Briefly stated, embodiments of the present invention are related to systems and methods for reading data from a memory device. The methods generally involve receiving first read request signals at the memory device for first data stored therein. In response to the first read request signals, a first page of data is retrieved from a cell array of the memory device. Thereafter, second read request signals are received at the memory device for second data stored therein. After receiving the second read request signals, it is determined if at least a portion of a memory address for the second data is the same as at least a respective portion of a memory address for the first data. If it is determined that the respective portions of the memory addresses are the same, then a read access to the cell array is disabled. The memory addresses can include, but are not limited to, a logic unit address, a block address and a page address.

Notably, the methods of the present invention facilitate power saving when the same page of data is to be retrieved from a memory cell array two or more consecutive times. Also, the read access time in the memory device for a consecutive read is reduced.

The present invention will now be described in detail in relation to FIGS. 1-6. Although the present invention will be described in relation to a NOR flash memory application, embodiments of the present invention are not limited in this regard. For example, the present invention can be used in any memory device that supports an execute in place (XIP) model. XIP models are well known those having ordinary skill in the art, and therefore will not be described herein. Notably, the present invention can be integrated into various electronic devices. Such electronic devices include, but are not limited to, handsets (e.g., handheld computers, personal digital assistants, mobile phones, handheld radios, portable global positioning systems) and other computing devices that require non-volatile memory systems.

Figure 1:
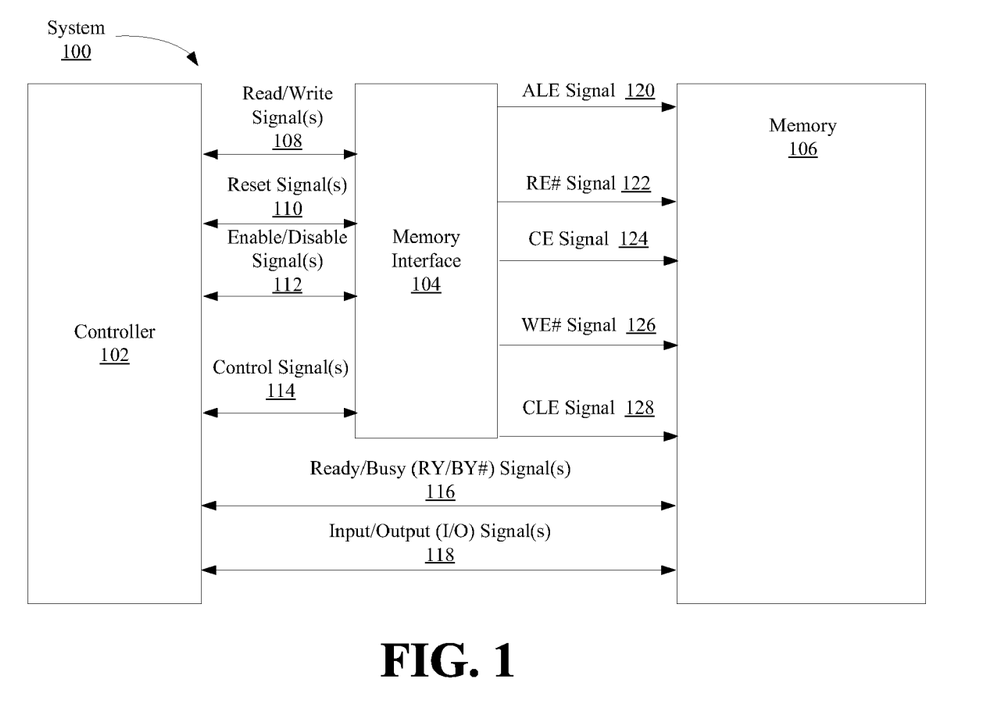
FIG. 1 is a block diagram of an exemplary system that is useful for understanding the present invention.

Referring to FIG. 1, there is provided a block diagram of an exemplary system 100 that is useful for understanding the present invention. As shown in FIG. 1, the system 100 comprises a controller 102, a memory interface 104 and a memory 106. The controller 102 is generally configured for controlling the operations of the memory 106. In this regard, the controller 102 is electrically connected to the memory 106 via the memory interface 104. The controller 102 communicates read/write signals 108, reset signals 110, enable/disable signals 112 and other control signals 114 to and from the memory interface 104. The controller 102 is also configured to communicate control signals to and from the memory 106. The controls signals include, but are not limited to, Ready/Busy (RY/BY#) signals 116 and Input/Output (I/O) signals 118. The control signals 116, 118 will be described below.

The memory interface 104 is electrically connected to the memory 106. The interface 104 provides a common interface between the controller 102 and memory 106. In this regard, the interface 104 communicates command signals to the memory 106. Such command signals include, but are not limited to, an Address Latch Enable (ALE) signal 120, an RE# signal 122, a Chip Enable (CE) signal 124, a WE# signal 126 and a Command Latch Enable (CLE) signal 128. Each of these command signals 120, 122, 124, 126, 128 will be described below.

The memory interface 104 communicates the RE# signal 122 and/or the WE# signal 126 to the memory 106 based on the type of operation to be performed thereby. For example, the RE# signal 122 is communicated from the memory interface 104 to the memory 106 when a read operation is to be performed by the memory 106. The WE# signal 126 is communicated from the memory interface 104 to the memory 106 when a write operation is to be performed by the memory 106. An exemplary embodiment of the memory 106 will now be described in detail below in relation to FIGS. 2-4.

Figure 2:
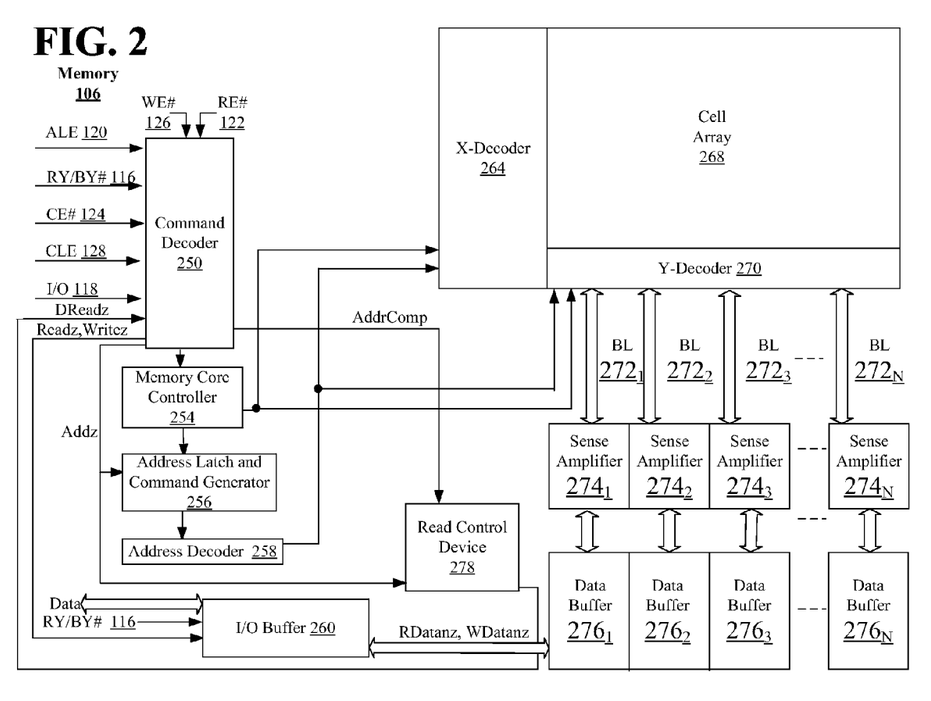
FIG. 2 is a block diagram of a non-volatile memory device that is useful for understanding the present invention.

Referring now to FIG. 2, there is provided a block diagram of an exemplary embodiment of the memory 106 shown in FIG. 1. As shown in FIG. 2, the memory 106 comprises a command decoder 250, a memory core controller 254, an Address Latch and Command Generator (AL/CG) 256, an address decoder 258, an Input/Output (I/O) buffer 260 and a read control device 278. The memory 260 also comprises at least one data buffer $276_1, 276_2, 276_3, \ldots, 276_N$, at least one sense amplifier $274_1, 274_2, 274_3, \ldots, 274_N$, a Y-decoder 270, an X-decoder 264 and at least one cell array 268. Although data buffers $276_1, 276_2, 276_3, \ldots, 276_N$ are shown in FIG. 2, embodiments of the present invention are not limited in this regard. For example, the data buffers can be replaced with one or more caches or SRAMs.

The cell array 268 is configured to store at least one page (not shown) of data (e.g., 512 bytes of data). An exemplary memory organization for the cell array 268 will be described below in relation to FIG. 3. However, it should be understood that the cell array 268 comprises a plurality of unit cells (e.g., unit cells $402_1, 402_2, \ldots, 402_g, 402_{g+1}, 402_{g+2}, \ldots, 402_G$ shown in FIG. 4) for storage of data. Each unit cell (e.g., unit cells $402_1, 402_2, \ldots, 402_g, 402_{g+1}, 402_{g+2}, \ldots, 402_G$ shown in FIG. 4) is configured to store one (1) bit of data.

The command decoder 250 receives command signals from external command generating devices (not shown in FIG. 2). Such command signals include, but are not limited to, the ALE signal 120, the RY/BY# signal 116, the CE# signal 124, the CLE signal 128, the I/O signal 118, the WE# signal 126 and the RE# signal 122.

As should be understood, the CE# signal 124 controls the operational mode of the memory 106. The operational modes include, but are not limited to, a read mode and a write mode. When the memory 106 is in its read mode, the RE# signal 122 is used to control a data output of the memory 106. The data output is triggered on the falling edges of pulses of the RE# signal 122. When the memory 106 is in its write mode, the WE# signal 126 is used to control a data input to the memory 106. The data input is triggered on the rising edges of pulses of the WE# signal 126.

During a command or address load sequence, the CE# signal 124 is low prior to the falling edge of the WE# signal 126. The ALE signal 120 controls writing to the address latch 256 in all operational modes of the memory 106. When the ALE signal 120 is high, an address is loaded on the falling edge of the WE# signal 126. The ALE signal 120 remains high during an entire address sequence.

The CLE signal 128 controls writing to the command register (not shown in FIG. 2). When the CLE signal 128 is high, the command is loaded into the memory 106 on the falling edge of a pulse of the WE# signal 126. The I/O signal 118 includes command information, address information and data communicated to and from the command decoder 250. The RY/BY# signal 116 indicates the operation status of the memory 106. When the RY/BY# signal 116 is high, the memory 106 is performing an operation such as a read mode operation, a write mode operation or other memory related operation.

As shown in FIG. 2, the command decoder 250 is communicatively coupled to the memory core controller 254, the read control device 278 and the I/O Buffer 260. The command decoder 250 communicates commands to the memory core controller 254, the read control device 278 and the I/O Buffer 260 for controlling the operations thereof. The command decoder 250 can include, but is not limited to, a plurality of logic devices (not shown in FIG. 2) and a plurality of switches (not shown in FIG. 2). The command decoder 250 generates a command signal Readz and communicates the same to the I/O buffer 260 when a read command is received thereat. The command decoder 250 also generates a command signal AddrComp and communicates the same to the read control device 278 when a read command is received thereat. The read command can be defined as "00h". Similarly, the command decoder 250 generates the command signal Writez and communicates the same to the I/O buffer 260 when the write command is received thereat. The write command can be defined as "80h". Embodiments of the present invention are not limited in this regard.

The read control device 278 performs read mode operations when the command signal AddrComp is received from the command decoder 250. In this regard, the read control device 278 is generally configured to determine if second data to be read from the memory 106 is contained in the same page from which first data was previously retrieved. This determination can be accomplished by comparing at least a portion of a memory address for the second data to at least a portion of a memory address for the first data. In this regard, the read control device 278 can include one or more comparators and a storage device. Each of the memory addresses can include, but is not limited to, a start address, a logic unit address, a block address and/or a page address. In this scenario, a determination can be made as to whether the page address for the second data matches or is the same as the page address for the first data. If the page addresses do not match each other or are not the same, then the memory 106 performs conventional read operations. The conventional read operations involve transferring one or more pages of data from the cell array 268 to the data buffer(s) $276_1, 276_2, 276_3, \ldots, 276_N$. The conventional read operations will be described in more detail below.

However, if the page addresses match each other or are the same, then the read control device 278 generates a disable command DReadz to disable a read access to a memory cell array 268. The disable command DReadz is communicated from the read control device 278 to the command decoder 250. Consequently, the page of data is not retransferred from the cell array 268 to the data buffer(s) $276_1$, $276_2$, $276_3$, ..., $276_N$. As a result, power saving is achieved when the same page of data is retrieved from the memory device 106 two or more consecutive times. Also, the read access time in the memory device 106 for a consecutive read request is reduced.

The memory core controller 254 generally controls the operations of the Y-decoder 270 and the X-decoder 264. The Y-decoder 270 and the X-decoder 264 are communicatively coupled to the cell array 268. Each of the decoders 270, 264 is configured to select unit cells (e.g., unit cells $402_1$, $402_2$, ..., $402_g$, $402_{g+1}$, $402_{g+2}$, ..., $402_G$ shown in FIG. 4) for the storage of data. The Y-decoder 270 is communicatively coupled to the one or more sense amplifiers $274_1$, $274_2$, $274_3$, ..., $274_N$ via bit lines $272_1$, $272_2$, $272_3$, ..., $272_N$. Each sense amplifier $274_1$, $274_2$, $274_3$, ..., $274_N$ is an electronic amplifier circuit configured to sense (or read) and refresh (or program) the value of a bit stored in a unit cell (e.g., unit cells $402_1$, $402_2$, ..., $402_g$, $402_{g+1}$, $402_{g+2}$, ..., $402_G$ shown in FIG. 4). The sense amplifiers $274_1$, $274_2$, $274_3$, ..., $274_N$ are communicatively coupled to the data buffers $276_1$, $276_2$, $276_3$, ..., $276_N$. Each of the data buffers $276_1$, $276_2$, $276_3$, ..., $276_N$ is configured to receive data to be programmed (or written) to the cell array 268 from the I/O buffer 260. Each of the data buffers $276_1$, $276_2$, $276_3$, ..., $276_N$ is also configured to communicate data read from the cell array 268 to the I/O buffer 260.

The I/O buffer 260 is communicatively coupled to an external data source (not shown in FIG. 2) so as to receive data therefrom or communicate data thereto. As such, the I/O buffer 260 can include, but is not limited to, a plurality of logic devices (not shown in FIG. 2), a plurality of switches (not shown in FIG. 2) and a plurality of transistors (not shown in FIG. 2). When the memory 106 is in its read mode, the I/O buffer 260 receives a command signal Readz from the command decoder 250 and a RY/BY# signal 116 from an external device (not shown in FIG. 2). In response to the Readz signal and RY/BY# signal 116, the I/O buffer 260 outputs data RDatanz received from the data buffer(s) $276_1$, $276_2$, $276_3$, ..., $276_N$. This data RDatanz is output at a particular data transfer rate. When the memory 106 is in its write mode, the I/O buffer 260 receives the signals Writez from the command decoder 250 and RY/BY# signal 116 from an external device (not shown in FIG. 2). In response to the Writez signal and the RY/BY# signal 116, the I/O buffer 260 communicates input data WDataz to the data buffer(s) $276_1$, $276_2$, $276_3$, ..., $276_N$ at a particular data transfer rate. Embodiments of the present invention are not limited in this regard.

The AL/CG 256 receives address information Addz from the command decoder 250 and processes the same. The AL/CG 256 communicates signals to the command decoder 250 indicating the status of the memory 106. The AL/CG 256 also communicates signals to the address decoder 258 indicating a memory address to which data is to be read from or the unit cell (e.g., unit cells $402_1$, $402_2$, ..., $402_g$, $402_{g+1}$, $402_{g+2}$, ..., $402_G$ shown in FIG. 4) that is to have it's value refreshed. The address decoder 258 communicates address information to the Y-decoder 270 and the X-decoder 264.

Figure 3:
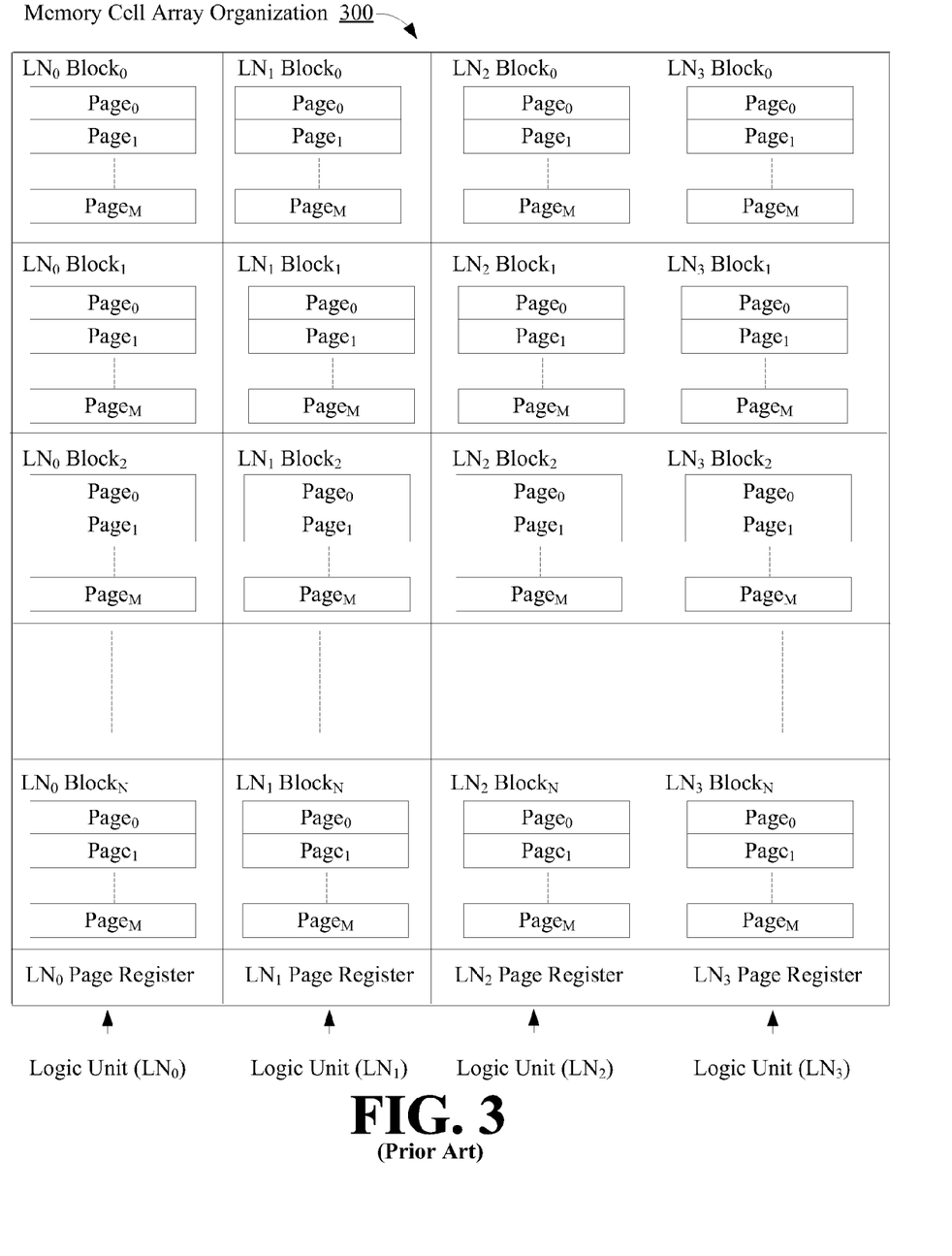
FIG. 3 is a detailed block diagram of the memory cell array shown in FIG. 2 that is useful for understanding the present invention.
Figure 4:
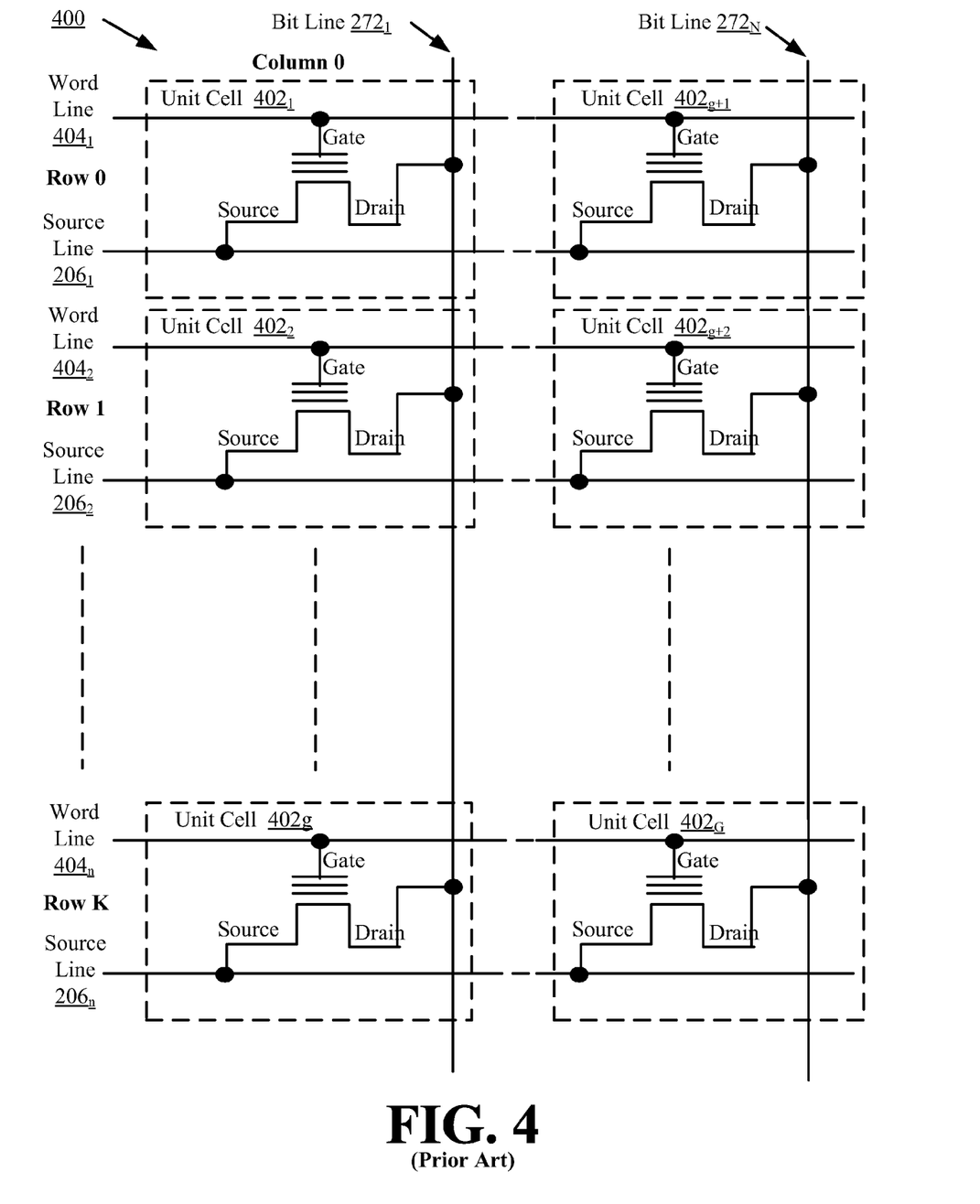
FIG. 4 is a schematic illustration of an exemplary memory cell structure of a data block of the memory cell array shown in FIG. 3 that is useful for understanding the present invention.

Referring now to FIG. 3, there is provided an exemplary memory organization 300 of the cell array 268 shown in FIG. 2 that is useful for understanding the present invention. As shown in FIG. 3, the memory organization 300 comprises a plurality of logic units $LN_0$, $LN_1$, $LN_2$, $LN_3$. Each of the logic units $LN_0$, $LN_1$, $LN_2$, $LN_3$ is the minimum unit that can independently execute commands and report status. For example, it is permissible to start a Page Program operation on logic unit $LN_0$, and then prior to the operation's completion to start a Read command on logic unit $LN_1$. Each of the logic units $LN_0$, $LN_1$, $LN_2$, $LN_3$ comprises at least one page register and a memory array. The flash array includes a plurality of Logic Unit (LN) blocks $LN_0$ $Block_0$, $LN_0$ $Block_1$, ..., $LN_0$ $Block_N$, $LN_1$ $Block_0$, $LN_1$ $Block_1$, ..., $LN_1$ $Block_N$, $LN_2$ $Block_0$, $LN_2$ $Block_1$, ..., $LN_2$ $Block_N$, $LN_3$ $Block_0$, $LN_3$ $Block_1$, ..., $LN_3$ $Block_N$. Each of the UN blocks is the smallest erasable unit of data within the memory array of a logic unit $LN_0$, $LN_1$, $LN_2$, $LN_3$. Each of the UN blocks contains a plurality of pages $Page_0$, $Page_1$, $Page_2$, ..., $Page_M$. Each page $Page_0$, $Page_1$, $Page_2$, ..., $Page_M$ is the smallest addressable unit for read and program operations. Each page $Page_0$, $Page_1$, $Page_2$, ..., $Page_M$ comprises a plurality of memory unit cells (e.g., unit cells $402_1$, $402_2$, ..., $402_g$, $402_{g+1}$, $402_{g+2}$, ..., $402_G$ shown in FIG. 4). Each unit cell (e.g., unit cells $402_1$, $402_2$, ..., $402_g$, $402_{g+1}$, $402_{g+2}$, ..., $402_G$ shown in FIG. 4) comprises a cell transistor coupled to a respective bit line $272_1$, $272_2$, $272_3$, ..., $272_N$ (shown in FIG. 2), a respective word line (e.g., word lines $404_1$, $404_2$, ..., $404_n$ shown in FIG. 4) and a respective source line (e.g., the source lines $406_1$, $406_2$, ..., $406_n$ shown in FIG. 4). Each unit cell (e.g., unit cells $402_1$, $402_2$, ..., $402_g$, $402_{g+1}$, $402_{g+2}$, ..., $402_G$ shown in FIG. 4) defines a logic state, either a "1" or a "0".

Figure 5:
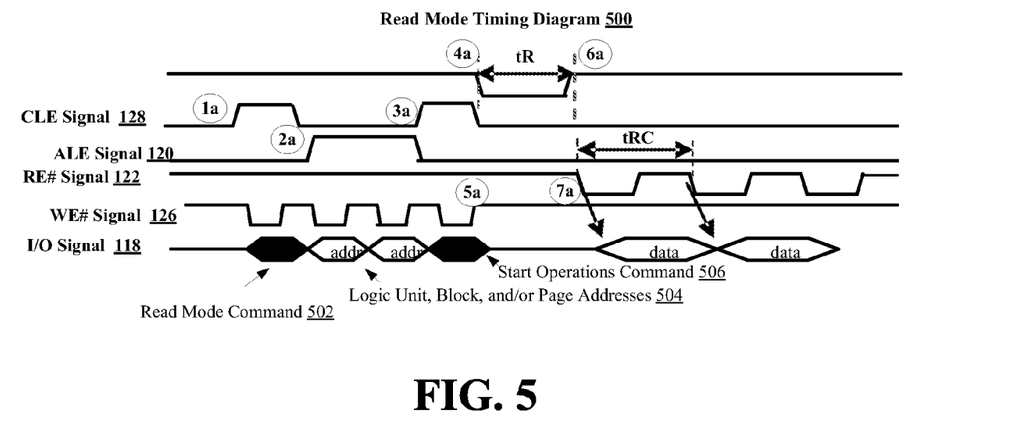
FIG. 5 is a schematic illustration of a read mode operation timing diagram that is useful for understanding the present invention.

Referring now to FIG. 5, there is provided a schematic illustration of a read mode operation timing diagram 500 that is useful for understanding the present invention. As shown in FIG. 5, the CLE signal 128 transitions from a low signal level to a high signal level at time 1a. While the CLE signal 128 has a high signal level, a first command 502 is loaded into the memory 106 on the falling edge of a pulse of the WE# signal 126. The first command 502 is communicated from an external device (e.g., the controller 102 of FIG. 1) to a command decoder 250 via an I/O signal 118. The first command 502 is provided for placing the memory 106 in it's read mode. After the first command 502 is loaded into the memory 106, the CLE signal 128 transitions from the high signal level to the low signal level.

Next, the ALE signal 120 transitions from a low signal level to a high signal level at time 2a. When the ALE signal 120 has a high signal level, address information 504 is loaded into the memory 106 on the falling edges of pulses of the WE# signal 126. The address information 504 can include, but is not limited to, a start address, a logic unit address, a block address and a page address. The address information 504 is communicated from the first external device (e.g., the controller 102 of FIG. 1) to the command decoder 250 of the memory via the I/O signal 118. After the address information 504 is loaded into the memory 106, the ALE signal 120 transitions from the high signal level to the low signal level.

Thereafter, the CLE signal 128 transitions from a low signal level to a high signal level at time 3a. While the CLE signal 128 has a high signal level, a second command 506 is loaded into the memory 106 on the falling edge of a pulse of the WE# signal 126. The second command 506 is communicated from the first external device (e.g., the controller 102 of FIG. 1) to the command decoder 250 of the memory 106 via the I/O signal 118. The second command 506 indicates the end of the address information 504. The second command 506 is a command for starting read mode operations to read data from a cell array 268. After the second command 506 is loaded into the memory 106, the CLE signal 128 transitions from the high signal level to the low signal level. Also, the WE# signal 126 transitions from the low signal level to the high signal level at time 5a. The WE# signal 126 maintains a high signal level while data is output from the memory 106.

It should be noted that while the first command 502, address information 504 and second command 506 are loaded into the memory 106, the RY/BY# signal 116 has a high signal level. After the second command 506 is loaded into memory 106, the RY/BY# signal 116 transitions from the high signal level to the low signal level at time 4a. Prior to outputting data from the memory 106, the RY/BY# signal 116 transitions from the low signal level to the high signal level at time 6a. The period of time between time 4a and time 6a is referred to as tR. The time period tR represents a "busy" period in which data will not be output from the memory 106. While data is output from the memory 106, the RY/BY# signal 116 maintains a high signal level.

As shown in FIG. 5, the data is output from the memory 106 at a particular data transfer rate. Accordingly, the data output is triggered only on the falling edges of pulses of an RE# signal 122. For example, the first data output is triggered on the falling edge of a first pulse of the RE# signal 122 at time 7a. The data is communicated from the memory 106 to the first external device via the I/O signal 118. However, embodiments of the present invention are not limited in this regard. For example, the data output from the memory can alternatively be triggered on the rising edges of pulses of the RE# signal 122 (not shown).

Figure 6:
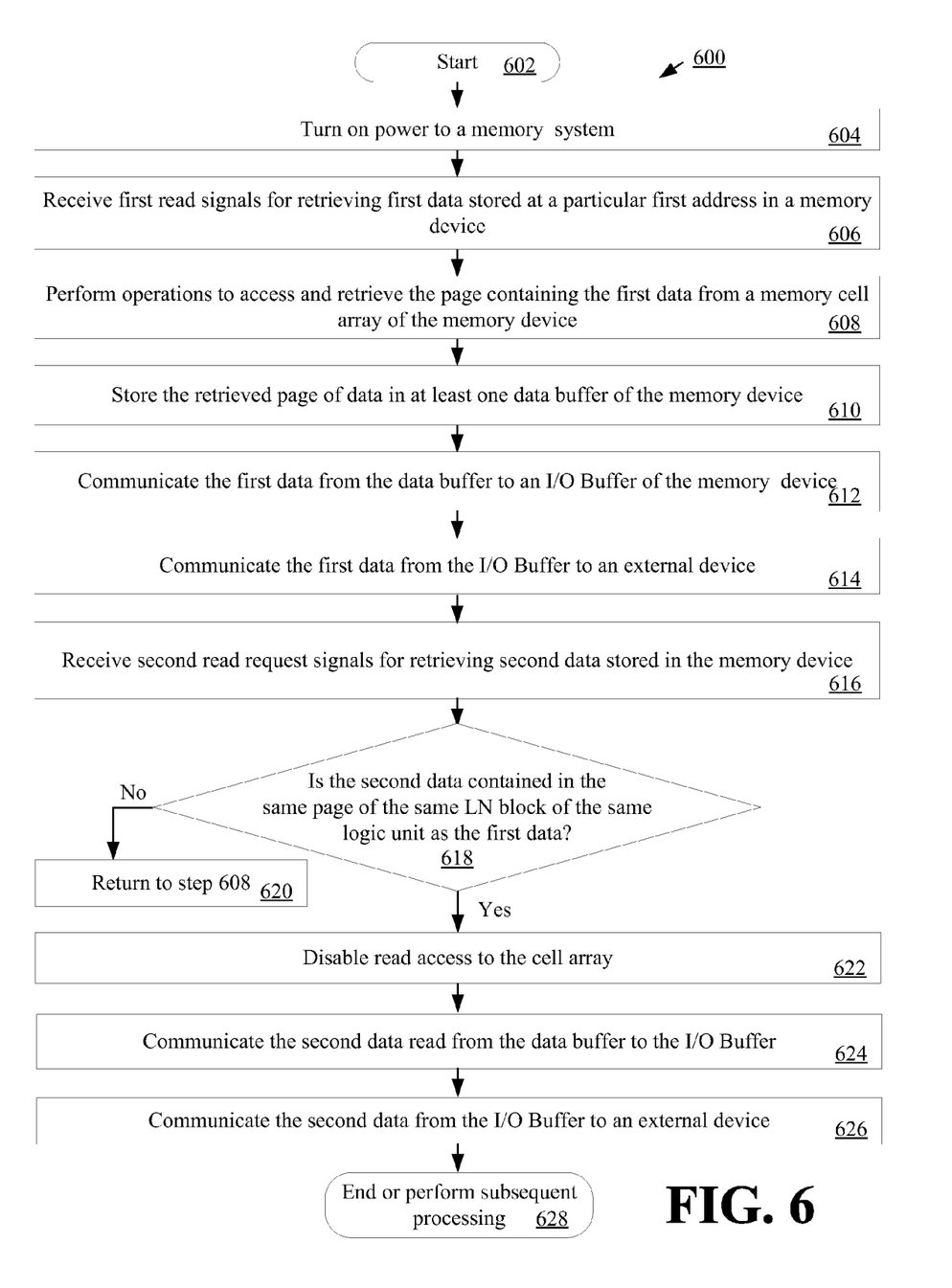
FIG. 6 is a flow diagram of a method for reading data from a memory device according to an embodiment of the present invention.

The following FIG. 6 and accompanying text illustrate a method 600 according to an embodiment of the present invention for reading data from a memory device. It should be appreciated, however, that the method 600 disclosed herein is provided for purposes of illustration only and that embodiments of the present invention are not limited solely to the method shown.

Referring now to FIG. 6, there is provided a schematic illustration of the method 600 for reading data from a memory device (e.g., memory device 106 of FIG. 1). As shown in FIG. 6, the method 600 begins with step 602 and continues with step 604. In step 604, a power supply to a memory system (e.g., the system 100 of FIG. 1) is turned on. Subsequently, step 606 is performed where first read signals are received at the memory device (e.g., memory device 106 of FIGS. 1-2). The first read signals are provided for retrieving first data from the memory device (e.g., memory device 106 of FIGS. 1-2). The first data is stored in a cell array (e.g., cell array 268 of FIG. 2) of the memory device in accordance with a particular application. For example, the first data is stored in a page (e.g., $Page_0$, $Page_1$, $Page_2$, ..., $Page_M$) of an LN block (e.g., $LN_0 Block_0$, $LN_0 Block_1$, ..., $LN_0 Block_N$, $LN_1 Block_0$, $LN_1 Block_1$, ..., $LN_1 Block_N$, $LN_2 Block_0$, $LN_2 Block_1$, ..., $LN_2 Block_N$, $LN_3 Block_0$, $LN_3 Block_1$, ..., $LN_3 Block_N$ of FIG. 3) of a logic unit (e.g., $LN_0$, $LN_1$, $LN_2$, $LN_3$) of the cell array. Embodiments of the present invention are not limited in this regard.

As evident from FIG. 5, step 606 can generally involve receiving a CLE signal 124 at the memory device including a read mode set command from an external device. The read mode set command can be defined by a transition of the CLE signal 124 from a low signal level to a high signal level. Thereafter, an I/O signal 118 including a read mode command 502 is received at the memory device. As a result of receiving the read mode command 502, the memory device is placed in it's read mode. Next, an ALE signal 120 including an address latch enable command is received at the memory device. The address latch enable command can be defined by a transition of the ALE signal 120 from a low signal level to a high signal level. In response to the address latch enable command, address information 504 is loaded into the memory device on the falling edges of pulses of the WE# signal 126. The address information 504 can include, but is not limited to, a start address, a logic unit address, a logic unit block address and a page address. After the address information 504 is loaded into the memory device, the ALE signal 120 transitions from the high signal level to the low signal level. Next, a CLE signal 124 including a fixed read command is received at the memory device. The fixed read command can be defined by a transition of the CLE signal 124 from a low signal level to a high signal level. In response to the fixed read command, an I/O signal 118 including a start operations command 506 is received at the memory device.

After receiving the start operations command 506 at the memory device, an RY/BY# signal 116 including a busy command is received at the memory device. The busy command can be defined by a transition of the RY/BY# signal 116 from a high signal level to a low signal level. A read inhibition control command and a ready command is also received at the memory device. The ready command can be defined by a transition of the RY/BY# signal 116 from the low signal level to the high signal level. The duration between the busy command and the ready command is referred to as tR. During the time period tR, data is not output from the memory device. After the time period tR has expired, an RE# signal 116 is received at the memory device. The RE# signal 116 is a pulse signal.

Referring again to FIG. 6, steps 608-614 are performed to output the first data at a particular data transfer rate. Notably, the data output from the memory device is triggered on the falling edges of the pulses of the RE# signal 116 as shown in FIG. 5. In step 608, operations are performed to access the cell array and retrieve the first data therefrom. In a next step 610, the retrieved data is stored in one or more data buffers (e.g., data buffers $276_1$, $276_2$, $276_3$, ..., $276_N$ of FIG. 2) of the memory device. In step 612, the first data is communicated from the data buffer(s) to an I/O buffer (e.g., the I/O buffer 260 of FIG. 2) of the memory device. In step 614, the I/O buffer communicates the first data to an external device. As should be understood, the memory device can exit its read mode after completion of step 614.

Upon completing step 614, the method 600 continues with step 616 where second read request signals are received at the memory device. The second read signals are provided for retrieving second data from the memory device. The second data is stored in the cell array of the memory device in accordance with a particular application. For example, the second data is stored in a page of an LN block of a logic unit of the cell array. Embodiments of the present invention are not limited in this regard.

The second read request signals are the same as or similar to the first receive request signals. As such, the above discussion of the first read request signals is sufficient for understanding the second read request signals. However, it should be understood that, during the time period tR, a decision step 618 is performed at the memory device to determine if the second data is contained in the same page of the same LN block of the same logic unit as the first data. This determination can be accomplished by comparing an address for the second data to the address for the first data. As noted above, each of the addresses can include, but is not limited to, a logic unit address, a logic unit block address and a page address. In this scenario, the logic unit addresses are compared to each other to determine if they are the same. Similarly, the logic unit block addresses are compared to each other to determine if they are the same. Likewise, the page addresses are compared to each other to determine if they are the same. Embodiments of the present invention are not limited in this regard. For example, if the comparison of the logic unit addresses indicates that they are not the same, then the comparisons of the logic unit block addresses and page addresses may not be performed.

If it is determined that the second data is not contained in the same page of the same LN block of the same logic unit as the first data [618:NO], then the method 600 continues with step 620 where it returns to step 608. However, if it is determined that the second data is contained in the same page of the same LN block of the same logic unit as the first data [618:YES], then the method 600 continues with step 622. In step 622, a read access to the cell array is disabled. This read access disablement is generally achieved by communicating a disable command DReadz from a read control device (e.g., the read control device 278 of FIG. 2) to a command decoder (e.g., the command decoder 250 of FIG. 2) of the memory device. In response to the disable command DReadz, the command decoder disables a read access to the memory cell. Consequently, the page containing the first and second data is not retransferred from the cell array to the data buffer(s). As a result, power saving is achieved and the read access time in the memory device is reduced.

After completing step 622, step 624 is performed where the second data is communicated from the data buffer(s) to the I/O buffer. In a next step 626, the second data is communicated from the I/O buffer to an external device. As should be understood, the memory device can exit its read mode after completion of step 626. Thereafter, step 628 is performed where the method 600 ends or other processing is performed.

In light of the forgoing description of the invention, it should be recognized that the present invention can be realized in hardware, software, or a combination of hardware and software. A method for reading data from a memory device according to the present invention can be realized in a centralized fashion in one processing system, or in a distributed fashion where different elements are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Of course, an application specific integrated circuit (ASIC), and/or a field programmable gate array (FPGA) could also be used to achieve a similar result.

Applicants present certain theoretical aspects above that are believed to be accurate that appear to explain observations made regarding embodiments of the present invention. However, embodiments of the present invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others having ordinary skill in the art upon the reading and understanding of this specification and the annexed drawings. In addition, while a particular feature of the present invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method for reading data from a memory device, comprising:
   receiving first read request signals for first data stored in said memory device;
   in response to said first read request signals, retrieving a first page of data from a cell array of said memory device;
   receiving second read request signals for second data stored in said memory device;
   determining if a page address for said second data is the same as a page address for said first page; and
   disabling a read access to said cell array if it is determined that the page address for said second data is the same as the page address for said first page.

2. The method according to claim 1, wherein said determining step further comprises comparing a page address for said second data to a page address for said first data to determine if said page addresses are the same.

3. The method according to claim 1, wherein said determining step further comprises comparing a logic unit address for said second data to a logic unit address for said first data to determine if said logic unit addresses are the same.

4. The method according to claim 1, wherein said determining step further comprises comparing a block address for said second data to a block address for said first data to determine if said block addresses are the same.

5. The method according to claim 1, further comprising retrieving a second page of data from said cell array if it is determined that said second data is not contained in said first page.

6. The method according to claim 1, further comprising storing said first page of data retrieved from said cell array in at least one data buffer of said memory device.

7. The method according to claim 6, further comprising retrieving said second data from said data buffer subsequent to said disabling step.

8. The method according to claim 1, wherein said memory device is a NOR flash memory device.

9. A memory device, comprising:
- a cell array configured to store a plurality of pages of data; and
- at least one processing element coupled to said cell array and configured to
  - (a) receive first read request signals for first data stored in said cell array, a first signal of said first read request signals including a first page address for a first page of said plurality of pages of data,
  - (b) retrieve said first page from said cell array in response to said first read request signals,
  - (c) receive second read request signals for second data stored in said cell array,
  - (d) determine if a page address for said second data is the same as a page address for said first page, and
  - (e) disable a read access to said cell array if it is determined that the page address for said second data is the same as the page address for said first page.

10. The memory device according to claim 9, wherein a first signal of said second read request signals includes a second page address, and said processing element is further configured to compare said second page address to said first page address to determine if said first and second page addresses are the same.

11. The memory device according to claim 9, wherein said processing element comprises a means for comparing at least a portion of a second memory address for said second data to at least a respective portion of a first memory address for said first data.

12. The memory device according to claim 9, wherein
- said first signal of said first read request signals further includes a first logic unit address,
- said first signal of said second read request signals further includes a second logic unit address, and
- said processing element is further configured to compare said second logic unit address to said first logic unit address to determine if said first and second logic unit addresses are the same.

13. The memory device according to claim 9, wherein
- said first signal of said first read request signals further includes a first block address,
- said first signal of said second read request signals further includes a second block address, and
- said processing element is further configured to compare said second block address to said first block address to determine if said first and second block addresses are the same.

14. The memory device according to claim 9, wherein said processing element is further configured to retrieve a second page of said plurality of pages of data from said cell array if it is determined that said second data is not contained in said first page.

15. The memory device according to claim 9, further comprising at least one data buffer coupled to said cell array and configured to store said first page of data retrieved from said cell array.

16. The memory device according to claim 15, wherein said processing element is further configured to retrieve said second data from said data buffer subsequent to disabling said read access to said cell array.

17. The memory device according to claim 9, wherein said memory device is a NOR flash memory device.

18. A memory device, comprising:
- a cell array configured to store a plurality of pages of data; and
- at least one processing element coupled to said cell array and configured to
  - (a) receive first read request signals for first data stored in said cell array, a first signal of said first read request signals including a first memory address for first data,
  - (b) retrieve a first page of said plurality of pages of data from said cell array in response to said first read request signals,
  - (c) receive second read request signals for second data stored in said cell array, a first signal of said second read request signals including a second memory address,
  - (d) determine if at least a portion of said second memory address is the same as a respective portion of said first memory address,
  - (e) disable a read access to said cell array if it is determined that said portions of said first and second memory addresses are the same.

19. The memory device according to claim 18, wherein each of said first and second memory addresses includes at least one of a logic unit address, a block address and a page address.

20. The memory device according to claim 18, wherein said processing device comprises a means for comparing said portion of said second memory address to said respective portion of said first memory address.

21. A device, comprising:
- a NOR flash memory device that is configured as execute in place (XIP) memory, including,
  - a cell array configured to store a plurality of pages of data; and
  - at least one processing element coupled to said cell array and configured to
    - (a) receive first read request signals for first data stored in said cell array, a first signal of said first read request signals including a first page address for a first page of said plurality of pages of data,
    - (b) retrieve said first page from said cell array in response to said first read request signals,
    - (c) receive second read request signals for second data stored in said cell array,
    - (d) determine if a page address for said second data is the same as a page address for said first page, and
    - (e) disable a read access to said cell array if it is determined that the page address for said second data is the same as the page address for said first page.

* * * * *